United States Patent [19]
Iida et al.

[11] 3,958,137
[45] May 18, 1976

[54] THYRISTOR CIRCUIT
[75] Inventors: Takahiko Iida; Michiharu Ishido; Masao Hagihara, all of Itami, Japan
[73] Assignee: Mitsubishi Denki Kabushiki Kaisha, Tokyo, Japan
[22] Filed: Oct. 21, 1974
[21] Appl. No.: 516,682

[30] Foreign Application Priority Data
Oct. 23, 1973  Japan............................ 48-119293

[52] U.S. Cl............................ 307/282; 307/252 H; 307/318
[51] Int. Cl.² ...................................... H03K 17/14
[58] Field of Search.................. 307/282, 252 H, 318

[56]       References Cited
         UNITED STATES PATENTS
3,010,032  11/1961  Carney............................... 307/282

Primary Examiner—John S. Heyman
Attorney, Agent, or Firm—Oblon, Fisher, Spivak, McClelland & Maier

[57]       ABSTRACT

A thyristor circuit for generating a pulse current is provided having a by-pass circuit of a predetermined impedance which is placed in parallel to a saturable reactor. In this manner a small current is passed through the by-pass circuit during the unsaturated period of the saturable reactor so as to saturate the saturable reactor after enlarging the turn-on region of the thyristor to pass a pulse current having a high di/dt.

8 Claims, 10 Drawing Figures

THYRISTOR CIRCUIT

BACKGROUND OF THE INVENTION

1. Field of the Invention

This invention relates generally to semiconductor circuits for generating pulse currents and more particularly to a thyristor pulse generating circuit having means for preventing high temperatures at the hot spot of the thyristor and for improving the di/dt thereof.

2. Description of the Prior Art

When a thyristor having a low current-rising coefficient di/dt is triggered to pass a current having a high current-rising coefficient, the current is initially concentrated to pass on a semiconductor region. Accordingly, the region may be heated to a high temperature. In general, the high temperature heated part is referred to as a hot spot. When the temperature of the hot spot is increased too high, the thyristor may be damaged, the limit being provided by the di/dt rating. In a conventional circuit having such a thyristor, in order to improve the di/dt; a saturable reactor 5 has been inserted in series with a thyristor 6 as shown in FIG. 1a.

The effect of the saturable reactor is to permit passing of only the exciting current component of the saturable reactor through the thyristor by applying all of the voltage of the circuit to the saturable reactor until saturation of the saturable reactor even though the thyristor is triggered. In such a manner it was believed that the effect of the saturable reactor was to improve the thyristor di/dt by enlarging the initial turn-on region of the thyristor and by decreasing the switching loss.

While somewhat satisfactory, problems exist in the conventional circuit in that the exciting current component of the saturable reactor which is passed to the thyristor is small during the period for saturating of the saturable reactor. Accordingly, even though the saturable reactor is inserted, the saturable reactor is not very effective for enlarging the initial turn-on region and decreasing the switching loss. Thus, the temperature at the thyristor hot spot is not reduced and the di/dt of the thyristor is not effectively improved.

SUMMARY OF THE INVENTION

Accordingly, it is an object of the present invention to provide a new and improved unique and relatively simple semiconductor current pulse generating circuit.

Another object of the present invention is to provide a new and improved unique thyristor circuit for imparting a lower temperature at the hot spot of the thyristor and for preventing damage of the thyristor.

Yet another object of the present invention is to provide a new and improved unique thyristor circuit for improving the current rising coefficient di/dt of the thyristor.

Briefly, in accordance with the present invention the foregoing and other objects have been attained by providing a thyristor circuit having a by-pass circuit of a predetermined impedance which is placed in parallel to the saturable reactor. In this manner a small current is passed through the by-pass circuit during the unsaturated period of the saturable reactor so as to saturate the saturable reactor after enlarging the turn-on region of the thyristor to pass a pulse current having a high di/dt.

BRIEF DESCRIPTION OF THE DRAWINGS

The foregoing and other objects and features of the present invention may be clear from the following description when considered by referring to the drawings wherein like reference numerals indicate identical or corresponding parts throughout the several views and wherein:

FIGS. 2a, 2b to 5a, 5b are respectively diagrams of preferred embodiments of the pulse current generating circuits of the present invention and characteristic graphs for each of the embodiments.

DETAILED DESCRIPTION OF THE PREFERRED EMBODIMENTS

Figure 2A:
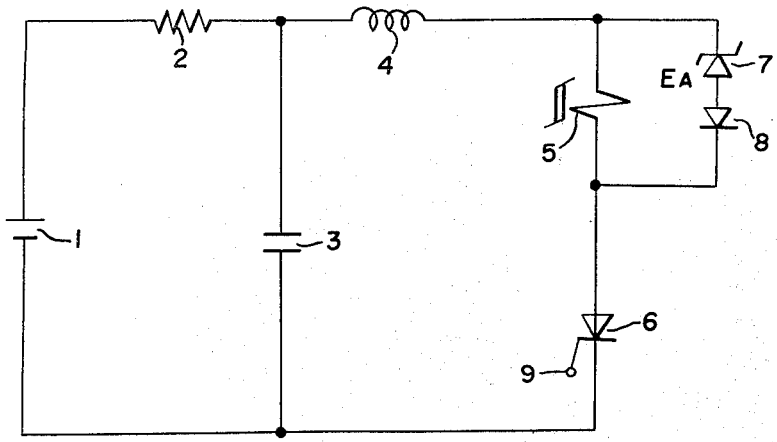

Referring now to the drawings FIG. 2a shows a circuit diagram of a pulse current generating circuit of the present invention, wherein the reference numeral 1 designates a DC power source; 2 designates a resistor; 3 designates a capacitor; 4 designates a reactor; 5 designates a saturable reactor; 6 designates a thyristor; 7 designates an avalanche diode; and 8 designates a diode. In the circuit of FIG. 2a, an electrical charge is provided from the DC power source 1 through the resistor 2 to the capacitor 3. When the gate signal is applied to a gate terminal g of the thyristor 6 to thereby trigger the thyristor, the charge of the capacitor 3 is passed through the reactor 4 and the saturable reactor 5.

Figure 1A:
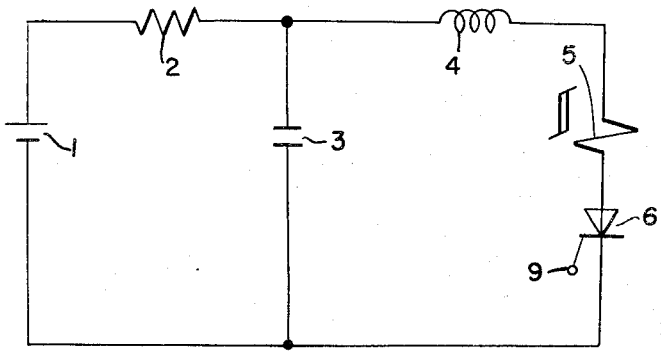
FIG. 1a is a diagram of one embodiment of a conventional pulse current generating circuit.
Figure 1B:
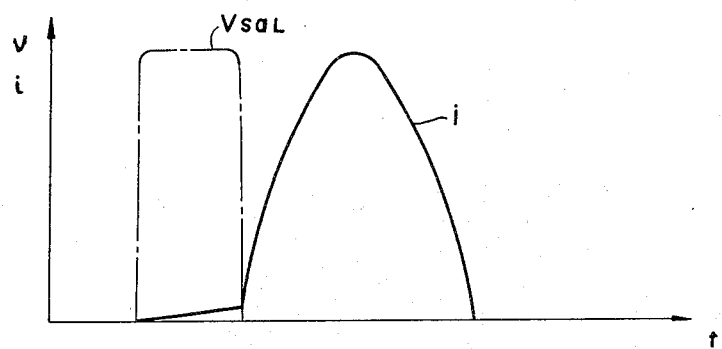
FIG. 1b is a characteristic graph of voltage and current waveforms.

In the case of the conventional pulse current generating circuit no by-pass circuit is connected in parallel to the saturable reactor 5 and the charged voltage of the capacitor 3 is applied to both terminals of the saturable reactor 5 until saturating the saturable reactor 5, as shown in FIG. 1a. Accordingly, in the conventional circuit, no substantial current is passed to the thyristor during the period of applying the voltage to the saturable reactor 5, and only the exciting current of the saturable reactor 5 is passed to it. The current is usually lower than several amperes, and accordingly the initial turn-on region of the thyristor is not substantially enlarged. Thus, the main pulse current having a high di/dt (main load current) is passed through the saturable reactor 5 to the thyristor 6 only when the saturable reactor 5 is saturated in this state. The current voltage waveforms in this state are shown in FIG. 1b wherein Vsal designates the voltage applied in both terminals of the saturable reactor 5.

In the case of the circuit of the present invention the avalanche diode 7 and the diode 8 are connected in parallel to the saturable reactor 5. The avalanche diode 7 is turned on by the voltage applied to the saturable reactor 5, and a by-pass current is passed through the diode 8. Accordingly, the avalanche voltage of the avalanche diode 7 must be set to a value lower than the voltage applied to the saturable reactor 5. During the unsaturated period of the saturable reactor, a predetermined current is passed through the by-pass circuit to the thyristor 6, and the initial turn-on region of the thyristor 6 is enlarged by the current. When the saturable reactor 5 is saturated, the current having a high di/dt (main load current) begins to pass.

Incidentally, it should be understood that the current passing during the unsaturated period, corresponds to the differential voltage between the charged voltage of the capacitor 3 and the avalanche voltage of the avalanche diode 7. Accordingly, the current can be set to a suitable value by selecting the avalanche voltage of the diode 7. In FIG. 2a, the current $i_a$ passing through the diode 7 is given by the equation $$i_a = (E_c - E_A) \cdot \sqrt{C/L} \cdot \sin \frac{1}{\sqrt{LC}} t \qquad [A]$$

wherein $E_c$ designates the charged voltage of the capacitor 3; and $E_A$ designates the avalanche voltage of the diode 7. The current rising coefficient $di_a/dt$ is given by the equation.

$$di_a/dt = \frac{E_c - E_A}{L} \qquad \left[\frac{A}{\sec}\right]$$

Figure 2B:
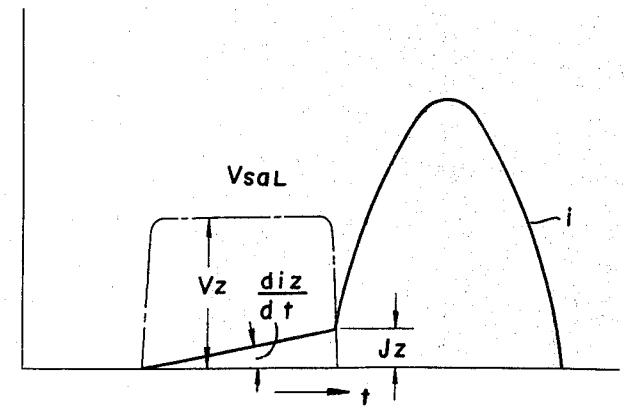

It should be apparent from the above that with the present invention the current rising coefficient di/dt is decreased $$\left(1 - \frac{E_A}{E_c}\right)$$

times as compared to that of the conventional circuit having no by-pass. The current waveform for the circuit of FIG. 2a is shown in FIG. 2b.

It should be understood that it is possible to use a constant voltage diode or a Zener diode instead of the avalanche diode 7. That is, it is possible to use a diode having a characteristic of yield by the voltage applied to both of the terminals during the unsaturated period of the saturable reactor 5.

Figure 3A:
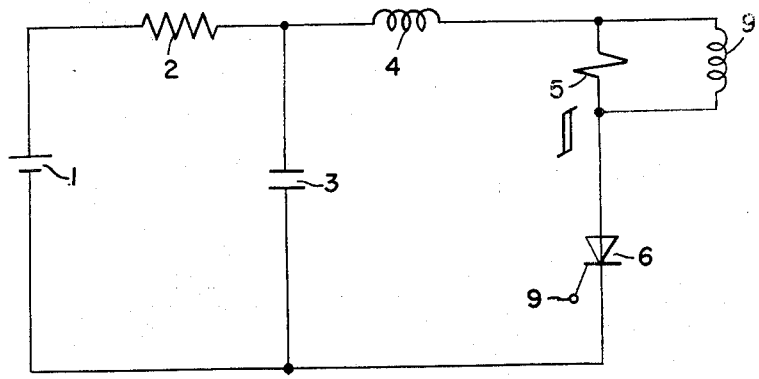

FIG. 3a shows another preferred embodiment of the present invention wherein the by-pass circuit is formed with a reactor 9. In this circuit, when the thyristor 6 is triggered, the voltage is applied to the saturable reactor 5 and the current is passed through the reactor 9 of the by-pass circuit to the thyristor 6 in a manner similar to the embodiment of FIG. 2a. The current can be easily changed by selecting a suitable inductance for the reactor 9. The current of the by-pass circuit $i_d$ can be given by the equation $$i_d = E_c \sqrt{C/(L + L_o)} \cdot \sin \frac{1}{\sqrt{C(L + L_o)}} t \qquad [A]$$

wherein C designates the capacity of the capacitor 3; $E_c$ designates the charged voltage of the capacitor 3; L designates the inductance of the reactor 4; and $L_o$ designates the inductance of the reactor 9 of the by-pass circuit. The rising coefficient $di_d/dt$ can be given by the equation $$di_a/dt = \frac{E_c}{L + L_o} \qquad [A/\sec]$$

Figure 3B:
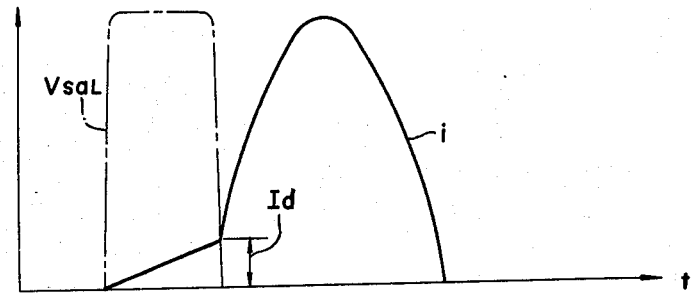
Figure 4A:
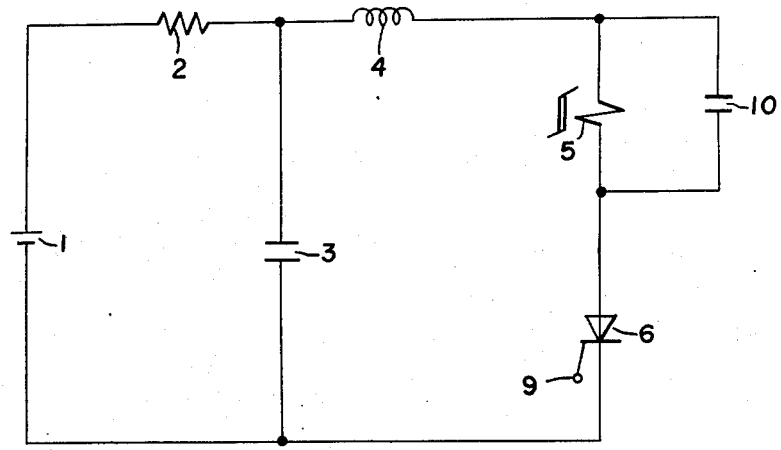

The current rising coefficient is decreased by (L/L + $L_o$) times as compared to that of the conventional circuit comprising no by-pass circuit. Thus, a main pulse current having a high di/dt (main load current) is passed through the saturable reactor 5 to the thyristor 6, when the saturable reactor 5 is saturated. The current and voltage waveforms of the embodiment of FIG. 3a are shown in FIG. 3b, wherein Id designates the current $i_d$ of the by-pass circuit when the saturable reactor 5 is saturated. FIG. 4a shows still another preferred embodiment of the present invention wherein a capacitor 10 is used in the by-pass circuit, whereby a similar operation to the above-mentioned embodiment is performed. The current $i_d$ of the by-pass circuit can be given by the equation $$i_d = E_c \sqrt{\frac{C_o}{L}} \cdot \sin \frac{1}{\sqrt{LC_o}} \cdot t \qquad [A]$$

wherein $C_o$ designates the capacity of the capacitor 10, the other elements are same as those of the former embodiment; and $C_o << C$. The current rising coefficient $di_d/dt$ can be given by the equation $$di_a/dt = \frac{E_c}{L} \qquad [A/\sec]$$

Figure 4B:
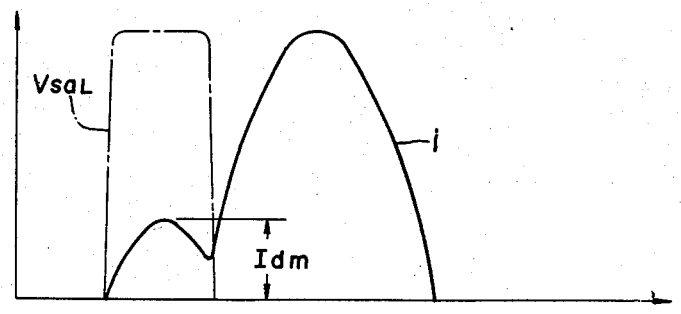

The current rising coefficient is the same as that of the conventional circuit having no by-pass circuit, however the peak value Idm of the current is decreased by $\sqrt{C_o/C}$ times and accordingly no hot spot of undesirably high temperature is formed. The current and voltage waveforms of the embodiment of FIG. 4a are shown in FIG. 4b.

Figure 5A:
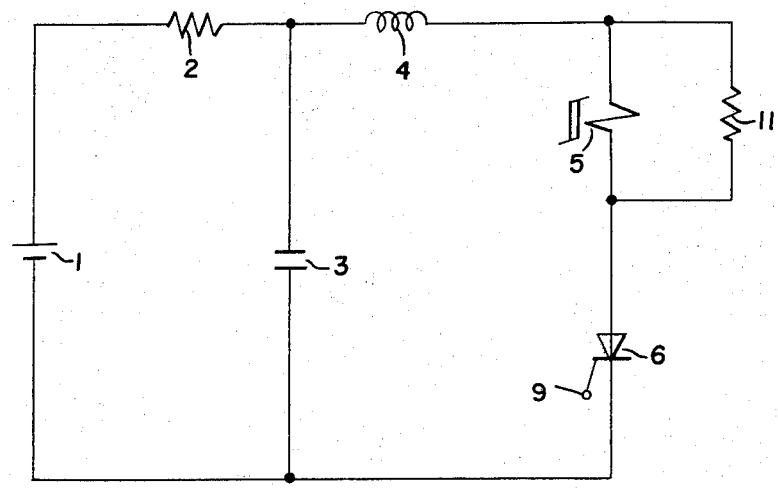

FIG. 5a shows another preferred embodiment of the present invention wherein a resistor 11 is used in the by-pass circuit. The current $i_d$ of the by-pass circuit can be given by the equation $$i_d = \frac{E_c}{R} e - \frac{1}{RC} t \qquad [A]$$

The current rising coefficient $di_d/dt$ from the equation is infinite. However, since the reactor 4 is in a practical case connected in series, the current rising coefficient is given by the equation $$di_d/dt = E_c/L \qquad [A/\sec]$$

and is substantially equal to the current rising coefficient of the conventional circuit having no by-pass circuit. However, in this case, the peak value of the current $I_d$ can be given by the equation $$I_d = E_c/R \qquad [A]$$

Figure 5B:
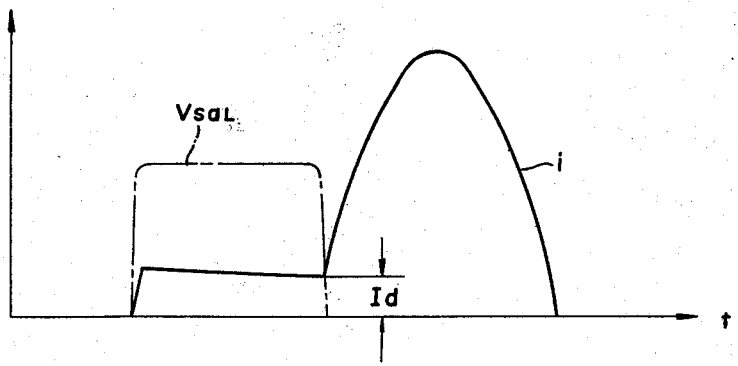

Accordingly, no hot spot of undesirably high temperature of the thyristor 6 is caused by the $di_d/dt$. The current and voltage waveforms of the embodiment of FIG. 5a are shown in FIG. 5b.

In the circuits shown in FIGS. 3a - 5a, the current $i_d$ passing through the by-pass circuit is passed by selecting a suitable value of the reactor 9, the capacitor 10 or the resistor 11 of the by-pass circuit so as to be enough to enlarge the initial turn-on region and to prevent the formaton of a hot spot of undesirably high temperature of the thyristor. In the above-mentioned embodiments while the reactor, the capacitor or the resistor have been individually used for the by-pass circuit it is possible to combine elements for the by-pass circuit.

As stated above, in the pulse current generating circuit having a high current rising coefficient di/dt a saturable reactor is connected in series to the thyristor, and a by-pass circuit of a constant voltage element or a suitable impedance element is connected in parallel to the saturable reactor, whereby the rise of the temperature at the hot spot of the thyristor is prevented and the current rise coefficient di/dt is improved such that a simple and effective pulse current generating circuit can be obtained. The invention can be applied not only to the usual thyristor having a unilateral rectification, but also to a thyristor having bilateral rectification and other semiconductor electrical valve means.

Obviously, numerous modifications and variations of the present invention are possible in light of the above teachings. It is therefore to be understood that within the scope of the appended claims the invention may be practiced otherwise than as specifically described herein.

What is claimed as new and desired to be secured by letters patent of the United States is:

1. An electrical circuit comprising:
   a thyristor for passing current having a high current-rising coefficient di/dt having a cathode, an anode and a gate,
   a saturable reactor having only two terminals, one of the terminals being connected to the anode or the cathode of the thyristor, neither terminal being connected to the gate of the thyristor,
   means for applying voltage across the saturable reactor and the thyristor so that current passing through the saturable reactor passes through the anode and cathode of the thyristor,
   a by-pass circuit having two terminals connected to the two terminals of the saturable reactor to pass current to the cathode and anode of the thyristor to enlarge the initial turn-on region of the thyristor during the unsaturated period of the saturable reactor to prevent a high temperature at the hot spot of the thyristor.

2. The electrical circuit according to claim 1 wherein the by-pass circuit comprises a constant voltage element.

3. The electrical circuit according to claim 2 wherein the by-pass circuit comprises an avalanche diode and a diode connected in series.

4. The electrical circuit according to claim 1 wherein the by-pass circuit comprises a reactor.

5. The electrical circuit according to claim 1 wherein the by-pass circuit comprises a capacitor.

6. The electrical circuit according to claim 1 wherein the by-pass circuit comprises a resistor.

7. The electrical circuit according to claim 1 wherein the by-pass circuit comprises a combination of reactor, capacitor and resistor elements.

8. An electrical circuit which comprises:
   a semiconductor element passing current having a high current-rising coefficient di/dt;
   a saturable reactor connected in series to said semiconductor element;
   a by-pass circuit connected in parallel to said saturable reactor, said by-pass circuit passing enough current to enlarge the initial turn-on region of said semiconductor element during the unsaturated period of said saturable reactor;
   the by-pass circuit being composed of a constant voltage element which yields by the voltage applied to said saturable reactor during the unsaturated period of said saturable reactor;
   the by-pass circuit being composed of an avalanche diode and a diode connected in series.

* * * * *